United States Patent [19]

Newton

[11] Patent Number: 4,573,006
[45] Date of Patent: Feb. 25, 1986

[54] APPARATUS FOR FEEDING ALTERNATE POLARITY PULSES TO A LOAD

[75] Inventor: Barry P. Newton, Chelmsford, England

[73] Assignee: English Electric Valve Company Limited, Chelmsford, England

[21] Appl. No.: 503,290

[22] Filed: Jun. 10, 1983

[30] Foreign Application Priority Data

Jun. 14, 1982 [GB] United Kingdom ............... 8217179

[51] Int. Cl.$^4$ ........................................... H02M 3/315
[52] U.S. Cl. .................................... 323/326; 323/324; 320/1; 307/110; 307/127
[58] Field of Search ............... 323/237, 239, 242, 320, 323/323, 324, 326; 320/1; 307/72, 108–110, 127, 138; 363/63

[56] References Cited

U.S. PATENT DOCUMENTS

| | | | |
|---|---|---|---|
| 3,371,232 | 2/1968 | Hannan et al. | 320/1 X |
| 3,611,111 | 10/1971 | Johnston | 320/1 X |
| 3,731,179 | 5/1973 | Rademaker | 307/127 X |
| 4,039,927 | 8/1977 | Richards, Jr. et al. | 320/1 X |
| 4,107,757 | 8/1978 | Masuda et al. | 320/1 X |
| 4,338,656 | 7/1982 | Yamakido | 307/127 X |

Primary Examiner—Peter S. Wong
Attorney, Agent, or Firm—Spencer & Frank

[57] ABSTRACT

Alternate polarity pulses of current are fed to a load L1A by charging a capacitor C5A alternately in different directions and closing unidirectional switches V2A and V3A at appropriate times to discharge the capacitor C5A through the inductor L1A. This arrangement is considered superior to an alternative system in which different capacitors are charged with different polarities to produce the different pulses. In the latter system the arrangement of switches needs to be such that the closing of one produces transient voltages which might cause the other switch to operate when it is not required to do so. In the illustrated system the switches V2A and V3A, being connected in parallel, do not suffer from this problem. In an alternative system the switches V2A and V3A could be replaced by a single bi-directional switch.

12 Claims, 4 Drawing Figures

APPARATUS FOR FEEDING ALTERNATE POLARITY PULSES TO A LOAD

BACKGROUND OF THE INVENTION

This invention relates to apparatus for feeding alternate polarity pulses to a load. The need for such apparatus arises in the construction of electromagnets in particle accelerators and FIG. 1 of the accompanying drawings shows a pulse train required for a particular accelerator.

Referring to FIG. 1 it will be seen that each pulse has a leading edge where the current rises from zero to 2500 amps within a period of 2 microseconds and then falls back to zero at a substantially constant rate during the next 3 milliseconds. Alternate pulses, of which only two are shown in FIG. 1, require the current to flow in opposite directions. Because of the high switching speeds and the high current values involved one is obliged, for applications of this type, to use switches which happen to need electrical signals to operate them. Thyratrons, thyristors and ignitrons are examples of such switches. They are usually, though not necessarily, unidirectional.

Initial consideration, by the inventor, of a method for producing pulses like those of FIG. 1, was based on a circuit as shown in FIG. 2 where the load, i.e. the electro-magnet, is schematically shown by the inductor L1.

Referring to FIG. 2, two 20 kV power supplies P1 and P2 of opposite polarity maintain opposite charges on respective capacitors C2 and C3. Two thyratrons V2 and V3 are closed at times shown on FIG. 1 by timing circuitry (not shown). These thyratrons are only maintained closed by the current that flows through them and so they open spontaneously after the end of each pulse at the times also shown on FIG. 1.

The timing circuitry also closes switches V1 and V4 at times, also shown on FIG. 1, when the current in load L1 has reached or just passed a maximum. When the switch V1 or V4 closes, stored current in an associated inductor L2 or L3 flows in the direction shown by the arrows through L1 to form the ramp-shaped trailing edge of approximately constant slope as shown on FIG. 1; this being required by the accelerator for reasons which will not be described since they are not of relevance to this invention.

Circuitry for storing current in the inductors L2 and L3 is not shown but could for example comprise a capacitor connected across a power supply and a switch for discharging the capacitor through the inductor L2 or L3 at appropriate times before each pulse.

Diodes D1 and D4 are included to prevent current flowing from L2 and L3 whilst the latter inductors are being energised. Capacitors C1 and C4 are included to reduce any discontinuity in the current through inductor L1 when the switches V1 and V4 are closed.

A problem of the circuit shown in FIG. 2 is that, whenever switch V2 or V3 is closed, the other switch V3 or V2 experiences a voltage transient (i.e. a fast voltage step) of 20 kV which is liable to cause that switch to close. When this happens a very large current flows from C3 to C2 or vice versa and no current flows through L1. This very large current can damage the switches These problems are so serious that the circuit shown in FIG. 2 is impracticable for certain applications.

SUMMARY OF THE INVENTION

This invention provides apparatus for feeding alternate polarity pulses to a load comprising a power supply for charging a capacitor with alternate polarities between pulses, switching means designed to be switched by electrical signal and forming a path or path for the discharge of the capacitor through the load and means for closing the switching means at appropriate times to produce the alternate polarity pulses in the load. The switching means can be formed by two unidirectional switches connected in parallel. Alternatively it can be a bi-directional switch. In either case the aforementioned problems can be overcome. In the case of unidirectional switches this is because, when one switch closes, it removes the voltage across the other. In the case of a bi-directional switch there is, of course, no other switch to be adversely affected by voltage transients.

BRIEF DESCRIPTION OF THE DRAWINGS

FIG. 4 illustrates the voltage across a storage capacitor in FIG. 3.

DESCRIPTION OF THE PREFERRED EMBODIMENTS

One particular way in which the invention may be performed will now be described by way of example with reference to FIG. 3 of the accompanying drawings which illustrates an apparatus for feeding alternate pulses of opposite polarity to an electro-magnet belonging to a particle accelerator.

Figure 3:
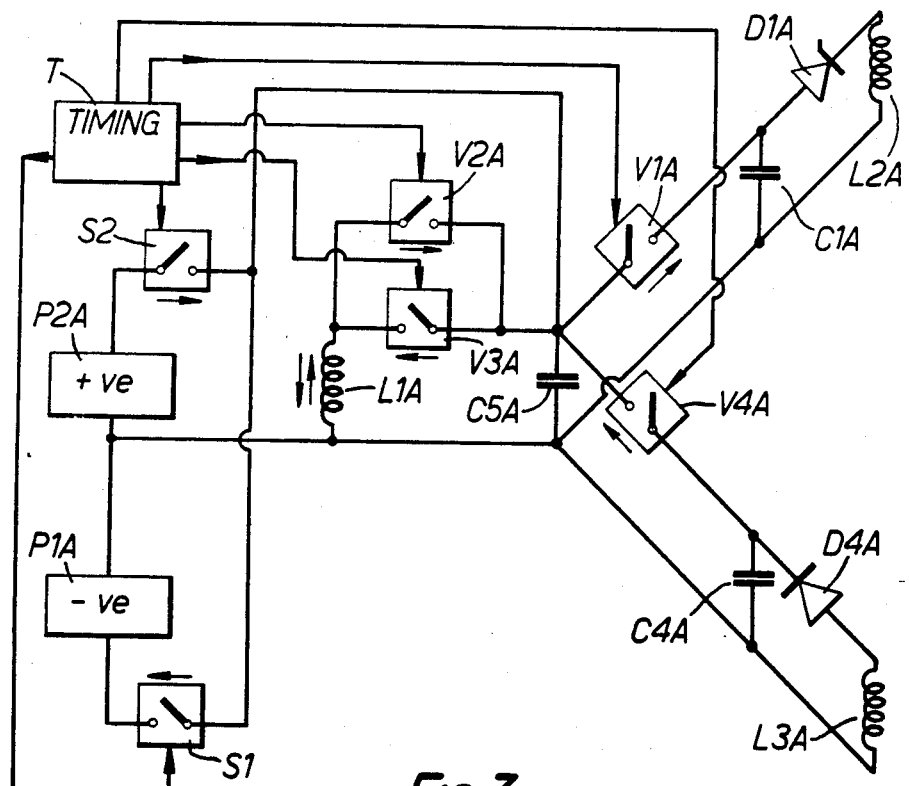
FIG. 3 is a schematic diagram of a circuit according to the present invention for feeding alternate pulses of opposite polarity to an electromagnet.

Referring now to FIG. 3, power supply P1A and P2A of opposite polarity are connected, via switches S1 and S2, to charge a capacitor C5A; and the varying voltage across this capacitor is shown in FIG. 4. Switches S1 and S2 are, in this particular embodiment of the invention, mechanical switches though, in practice, it would normally be more reliable to use thyratrons. These switches are opened and closed at times determined by a timing circuit (not shown) these times being indicated on FIG. 4. When switch S2 is closed one side of the capacitor C5A charges positively and when switch S1 is closed the same side of the capacitor C5A charges negatively.

Figure 1:
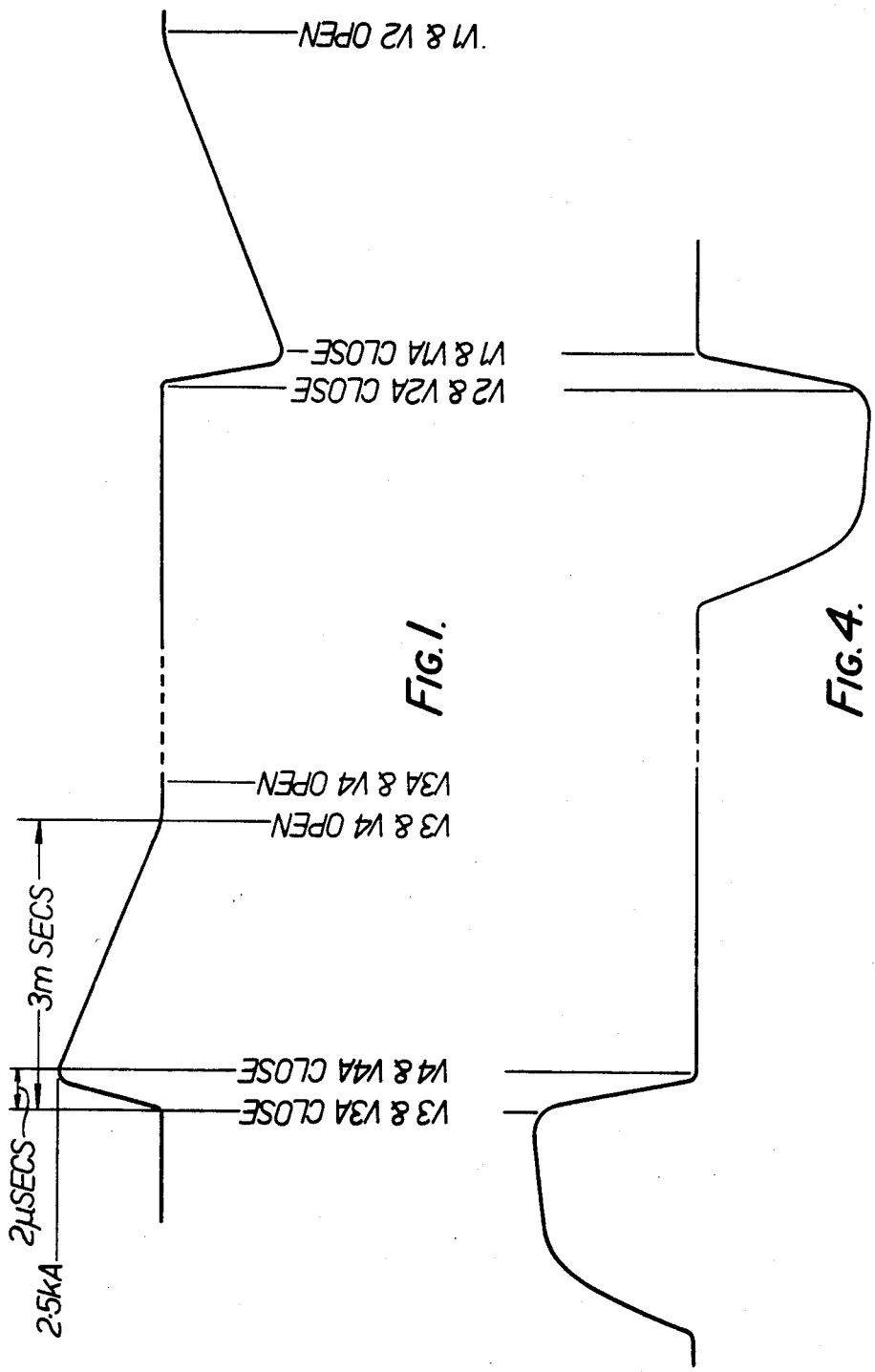
FIG. 1 illustrates a pulse train required for the electromagnets of a particle accelerator.
Figure 2:
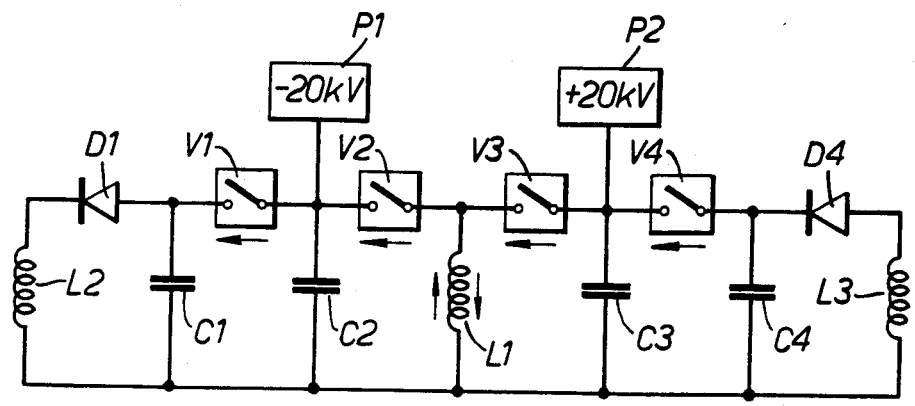
FIG. 2 is a schematic diagram of a circuit for producing the pulses of FIG. 1, said circuit however being subject to erratic switch operation due to voltage transients.

Two unidirectional switches (the direction of conduction of currents through a switch is indicated on the drawing by an arrow) V2A and V3A of a type designed to be operated by electrical signals are connected in parallel between the capacitor C5A and the load L1A which, like the load L1 of FIG. 2, is an electromagnet belonging to a particle accelerator. The switches V2A and V3A are closed at times also determined by the timing circuit T, these times being shown on FIG. 1. The switches V2A and V3A open spontaneously at times also shown on FIG. 1.

In an alternative form of the invention the uni-directional switches V2A and V3A could be replaced by a single bi-directional switch in which case only one timing signal to it is required.

A fixed time after switch V3A closes, switch V4A is caused to close, this fixed time being chosen so as to allow the currents through L1A to reach or slightly pass a maximum value. When switch V4A closes, current stored in an inductor L3A is allowed to pass through V3A to L1A to form the required constant slope ramp of the trailing edge of the pulse shown in FIG. 1.

A fixed time after switch V2A closes, switch V1A is caused to close, this fixed time being chosen so as to allow the current through L1A to reach or slightly pass a maximum negative value. When switch V1A closes current stored in an inductor L2A is allowed to pass through switch V2A and load L1A to form the required constant slope ramp of the second pulse as shown in FIG. 1.

The inductors L3A and L2A are energised with current in a manner similar to that described with reference to inductors L2 and L3 of FIG. 2. Also the functions of diodes D1A and D4A and capacitors C1A and C4A are similar to those of D1, D4, C1 and C4 of FIG. 2.

Switches V2A and V3A can be thyratrons, thyristors or ignitrons. In certain circumstances, it may be an advantage to use a thyratron and an ignitron in parallel so as to obtain the accurate timing possible with a thyratron combined with the long term high current conducting capability of the ignitron.

Tests conducted so far on a circuit like that of FIG. 3 have proved most promising in that the problems associated with the FIG. 2 circuit have been entirely eliminated apparently without any attendant disadvantages.

We claim:

1. Apparatus for feeding alternate polarity pulses to a load comprising a power supply for charging a capacitor with alternate polarities between pulses, switching means designed to be switched by electrical signals and forming a path or paths for the discharge of the capacitor through the load and means for closing the switching means at appropriate times to produce the alternate polarity pulses in the load.

2. Apparatus accord to claim 1 in which the switching means comprises two unidirectional switches connected in anti-parallel.

3. Apparatus according to claim 1 in which the switching means comprises a bi-directional switch.

4. Apparatus according to claim: 1,·wherein said alternate polarity pulses are of high energy and have sharp leading edges.

5. Apparatus for feeding alternate polarity pulses to an inductive load having first and second terminals, comprising:

a capacitor having a first terminal connected to the first terminal of the load and having a second terminal;

means for alternately connecting the second terminal of said capacitor to sources of positive and negative voltages to repreatedly charge said capacitor; and switch means connected between the second terminals of said capacitor and load for discharging said capacitor through the load each time said capacitor is charged.

6. Apparatus according to claim 5, wherein said switch means comprises unidirectional switches connected in anti-parallel.

7. Apparatus according to claim 5, wherein said switch means comprises a bi-directional switch.

8. Apparatus according to claim 5, further conq.rising wave-shaping means connected across the first and second terminals of said capacitor for shaping the waveform of the current pulses through said load to provide current pulses having ramp-shaped trailing edges.

9. Apparatus according to claim 8, wherein said wave-shaping means comprises inductor means for storing energy and additional switch means for connecting said inductor means across said capacitor.

10. Apparatus according to claim 9, wherein said inductor means comprises a series-connected combination of an inductor and a diode and an additional capacitor connected parallel to said series-connected combination.

11. Apparatus for feeding high energy, alternate polarity pulses having sharp leading edges to an inductive load having first and second terminals, comprising:

a capacitor having a first terminal connected to the first terminal of the load and having a second terminal;

charging means for alternately connecting the second terminal of said capacitor to source of positive and negative voltage exceeding ten kilovolts to repeatedly charge said capacitor;

switch means connected between the second terminal and of said capacitor and load for discharging said capacitor through the load at a peak current of over a kiloamp each time said capacitor is charged, said peak current being achieved within less than five microseconds.

12. Apparatus according to claim 11, wherein said charging means alternately connects the second terminal of said capacitor to sources of approximately 20 kilovolts, and wherein said switch means discharges said capacitor through the load at a peak current of approximately two and a half kiloamps, said peak current being achieved in approximately two microseconds.

* * * * *